United States Patent
Sommer et al.

(10) Patent No.: US 6,679,755 B1
(45) Date of Patent: Jan. 20, 2004

(54) CHEMICAL MECHANICAL PLANARIZATION SYSTEM

(75) Inventors: Phillip R. Sommer, Newark, CA (US); Paul D. Butterfield, San Jose, CA (US); Joshua T. Oen, Fremont, CA (US); Ching-Ling Meng, Fremont, CA (US)

(73) Assignee: Applied Materials Inc., Santa Clara, CA (US)

( * ) Notice: Subject to any disclaimer, the term of this patent is extended or adjusted under 35 U.S.C. 154(b) by 311 days.

(21) Appl. No.: 09/718,552

(22) Filed: Nov. 22, 2000

Related U.S. Application Data
(60) Provisional application No. 60/169,770, filed on Dec. 9, 1999.

(51) Int. Cl.[7] .............................................. B24B 51/00
(52) U.S. Cl. .......................................... 451/5; 451/173
(58) Field of Search ............................. 451/5, 288, 287, 451/334, 41, 173, 168

(56) References Cited

U.S. PATENT DOCUMENTS

| | | | |
|---|---|---|---|
| 5,565,034 A | 10/1996 | Nanbu et al. | 118/668 |
| 5,738,574 A | 4/1998 | Tolles et al. | 451/288 |
| 5,804,507 A | 9/1998 | Perlov et al. | 438/692 |
| 5,908,530 A | 6/1999 | Hoshizaki et al. | 156/345 |
| 5,944,940 A | 8/1999 | Toshima | 156/345 |
| 5,947,802 A | * 9/1999 | Zhang et al. | 451/334 |
| 6,036,582 A | 3/2000 | Aizawa et al. | 451/41 |
| 6,156,124 A | 12/2000 | Tobin | 118/719 |
| 6,196,896 B1 | 3/2001 | Sommer | 451/5 |

OTHER PUBLICATIONS

IBM Technical Disclosure Bulletin, New Handling Concept for Polishing Equipments, vol. 40, No. 2, (Feb.–1997).*

* cited by examiner

*Primary Examiner*—Robert A. Rose
(74) *Attorney, Agent, or Firm*—Moser, Patterson & Sheridan

(57) ABSTRACT

A processing system and method for processing a workpiece is generally provided. In one embodiment, the system includes a processing module and a substrate transfer shuttle. The processing module includes a polishing surface and at least one polishing head disposed above the polishing surface. The substrate transfer shuttle is movable between at least a first position and a second position where the second position is disposed adjacent the polishing head. At least one nest is disposed therein to receive and align the substrate. The nest also facilitates transfer of the workpiece to the processing head.

25 Claims, 8 Drawing Sheets

CHEMICAL MECHANICAL PLANARIZATION SYSTEM

This application claims benefit of U.S. Provisional Application No. 60/169,770, filed Dec. 9, 1999, which is incorporated herein by reference in its entirety.

BACKGROUND OF THE INVENTION

1. Field of the Invention

Embodiments of the present invention relate generally to a semiconductor wafer chemical mechanical planarization system having a substrate transfer shuttle for transferring a workpiece and methods related thereto.

2. Background of the Related Art

In semiconductor wafer processing, the use of chemical mechanical planarization, or CMP, has gained favor due to the enhanced ability to increase device density on a semiconductor workpiece, or wafer. As the demand for planarization of wafers as part of a semiconductor fabrication process increases, the requirement for higher system (i.e., tool) performance with enhanced wafer planarization has also increased.

Two such CMP systems that address these issues are described in U.S. Pat. No. 5,804,507, issued Sep. 8, 1998 to Perlov et al. and in U.S. Pat. No. 5,738,574, issued Apr. 15, 1998 to Tolles et al.. The Perlov et al. and Tolles et al. patents are incorporated herein by reference in their entirety. The Perlov et al. and Tolles et al. patents disclose a CMP system having a planarization apparatus that is supplied wafers from cassettes located in an adjacent liquid filled bath. A transfer mechanism, or robot, facilitates the transfer of the wafers from the bath to a transfer station. From the transfer station, the wafers are loaded to a polishing head. A carousel delivers the polishing head and wafer to various planarization stations where the wafers are planarized by moving the wafer relative to a rotating polishing material disposed on the planarization station in the presence of a polishing fluid. After completion of the planarization process, the wafer is returned back through the pedestal to the proper cassette located in the bath.

Another CMP system is disclosed in U.S. Pat. No. 5,908,530, issued Jun. 1, 1999 to Hoshizaki et al. and is incorporated herein by reference in its entirety. Hoshizaki et al. teaches an apparatus for planarizing wafers wherein the wafer held against a polishing material that is moved in an x/y motion. The relative motion between the polishing material and wafer results in the wafer surface being subjected to uniform velocity across the wafer's diameter. The uniform velocity across the wafer's surface advantageously provides a uniform material removal rate. Although Hoshizaki et al. provides excellent wafer surface processing and extended tool life, increased wafer throughput and expanded process versatility are desired as more device fabrication procedures include planarization steps.

Therefore, there is a need for an apparatus that facilitates increased throughput in a chemical mechanical wafer planarization system.

SUMMARY OF THE INVENTION

One aspect of the invention provides a system for processing a workpiece. In one embodiment, the system includes a processing module and a substrate transfer shuttle. The processing module includes a polishing surface and at least one polishing head disposed above the polishing surface. The substrate transfer shuttle is movable between at least a first position and a second position where the second position is disposed adjacent the polishing head. At least one nest is disposed in the substrate transfer shuttle. The nest transfers the workpiece to the processing head.

In another aspect of the invention, an apparatus for transferring a workpiece is provided. In one embodiment, the apparatus includes a base plate and an insert pad having a fluid distribution plate disposed therebetween. The base plate includes at least a first port and a second port for coupling to a fluid supply. The insert pad includes a plurality of centering fingers and a plurality of lift fingers. The centering fingers are fluidly coupled to the first port through the insert pad and distribution plate. The lift fingers are fluidly coupled to the second port through the insert pad.

In other aspect of the invention, a method for transferring a workpiece is provided. In one embodiment, the method includes the steps of placing the workpiece in a nest, centering the workpiece in the nest, and providing a fluid between the workpiece and nest during the centering step. In another embodiment, the method includes the steps of placing the workpiece in a nest disposed in a first position, moving the nest laterally to a second position adjacent a polishing head coupled to a first processing module, and transferring the workpiece from the nest to the polishing head.

BRIEF DESCRIPTION OF DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAIL DESCRIPTION OF INVENTION

Figure 1:
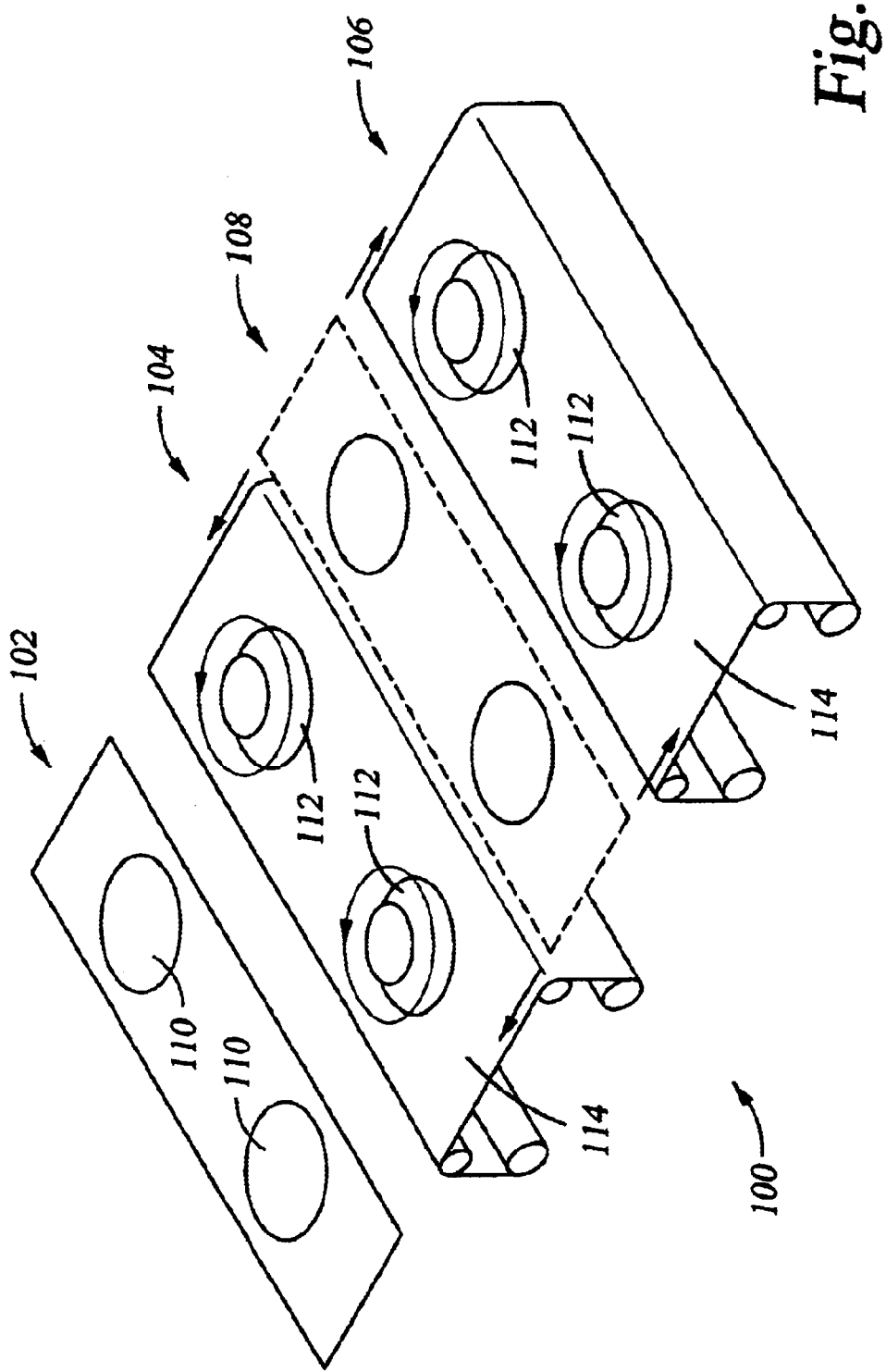
FIG. 1 is a schematic view of one embodiment of a chemical mechanical planarization system of the present invention.

FIG. 1 depicts a schematic view of one embodiment of a chemical mechanical planarization system 100. The system 100 generally comprises a factory interface or front end 102, a first processing module 104, a second processing module 106 and a substrate transfer shuttle 108. Generally, the front end 102 provides automated workpiece handling for loading and offloading workpieces or wafers 110 from the first processing module 104 and the substrate transfer shuttle 108. The substrate transfer shuttle table 104 provides a transport mechanism to deliver wafers 110 between the first processing module 104 and the second processing module 106 where the wafers 110 are processed. Optionally, the substrate transfer shuttle 108 may interface with the front end 102 or other substrate processing or handling equipment.

The first processing module 104 is disposed proximate the front end 102. The first processing module 104 is typically used to planarize the wafer 110. Alternatively, the first processing module 104 may comprise other wafer processing operations such as buffing, polishing, rinsing, storing, cleaning and/or other processes associated with planarizing a workpiece. The planarization process typically begins with the wafer 110 being transferred from the front end 102 to a polishing head 112. The polishing head 112 holds the wafer 110 from a backside, leaving the feature side of the wafer 110 exposed below the polishing head 112. The polishing head 112 is lowered to contact a working surface 114 of the first processing module 104. The wafer 110 is set in motion relative to the working surface 114. Typically, a polishing fluid is disposed between the wafer 110 and the working surface 114 to facilitate material removal from the feature side of the wafer 110. Generally, the polishing fluid includes reagents that react with the surface of the substrate and may optionally include abrasives. The working surface 114 may comprise conventional or fixed abrasive polishing material such as available from Rodel Inc., of Newark, Del. or 3M Company, of Saint Paul, Minn. Examples of such planarization modules are described in the previously incorporated U.S. Pat. No. 5,908,530 and U.S. patent application Ser. No. 08/961,602, filed Oct. 31, 1997 to Sommer. The Sommer patent application is additionally incorporated herein by reference in its entirety.

The planarization module described by Hoshizaki et al. generally holds the wafer stationary in a x/y-plane (ie., the plane of the working surface) while moving the wafer against the working surface along a z-axis. The working surface is actuated in the x/y plane creating a planarization pattern relative the wafer.

The planarization module described by Sommer generally holds the wafer in a polishing head that is articulated in the x/y-plane. The polishing head additionally is movable along a z-axis to create contact with a stationary working surface. As the polishing head is moved about the x/y-plane, the wafer is traversed about the working surface in a planarization pattern. Additionally, the polishing material disposed on the working surface may be releasably fixed upon the module such that the polishing material may be selectively advanced. Typically, the polishing material is fixed to a working surface during polishing by a vacuum or mechanical clamps and released from the working surface to facilitate advancing the polishing material between processing wafers. In this manner, at least a portion of the polishing material is replaced by an unused portion of polishing material between processing wafers.

The second processing module 106 is disposed adjacent the first processing module 104. The second processing module 106 comprises wafer processing operations such as planarizing, buffing, polishing, rinsing, cleaning and/or other process associated with planarizing a workpiece. In the illustrative embodiment, the second processing module 106 is identical to the first processing module 104. Optionally, additional processing modules may be incorporated into the system 100.

Figure 2A:
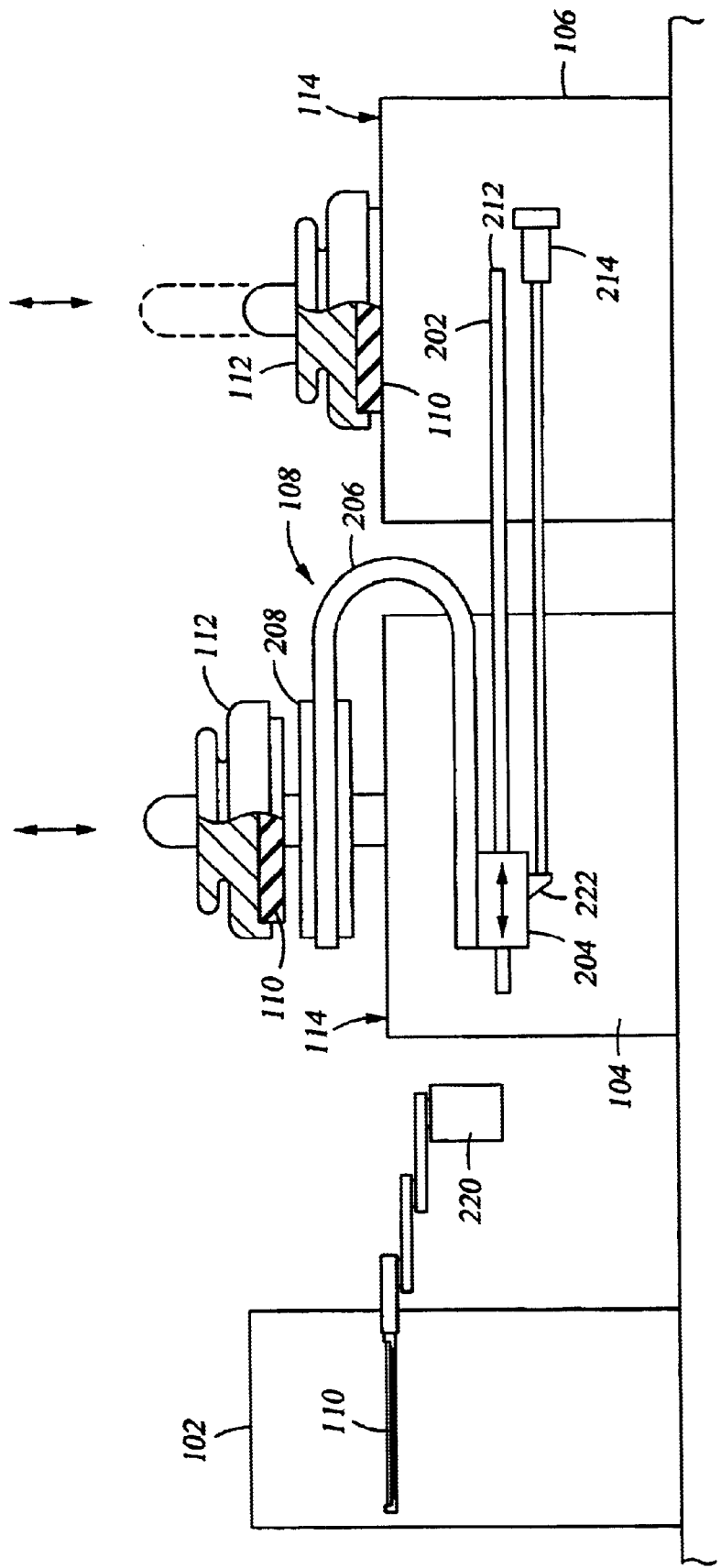
FIG. 2A is an elevation of the chemical mechanical planarization system of FIG. 1 depicting the substrate transfer shuttle loading a polishing head of a first process module.
Figure 2B:
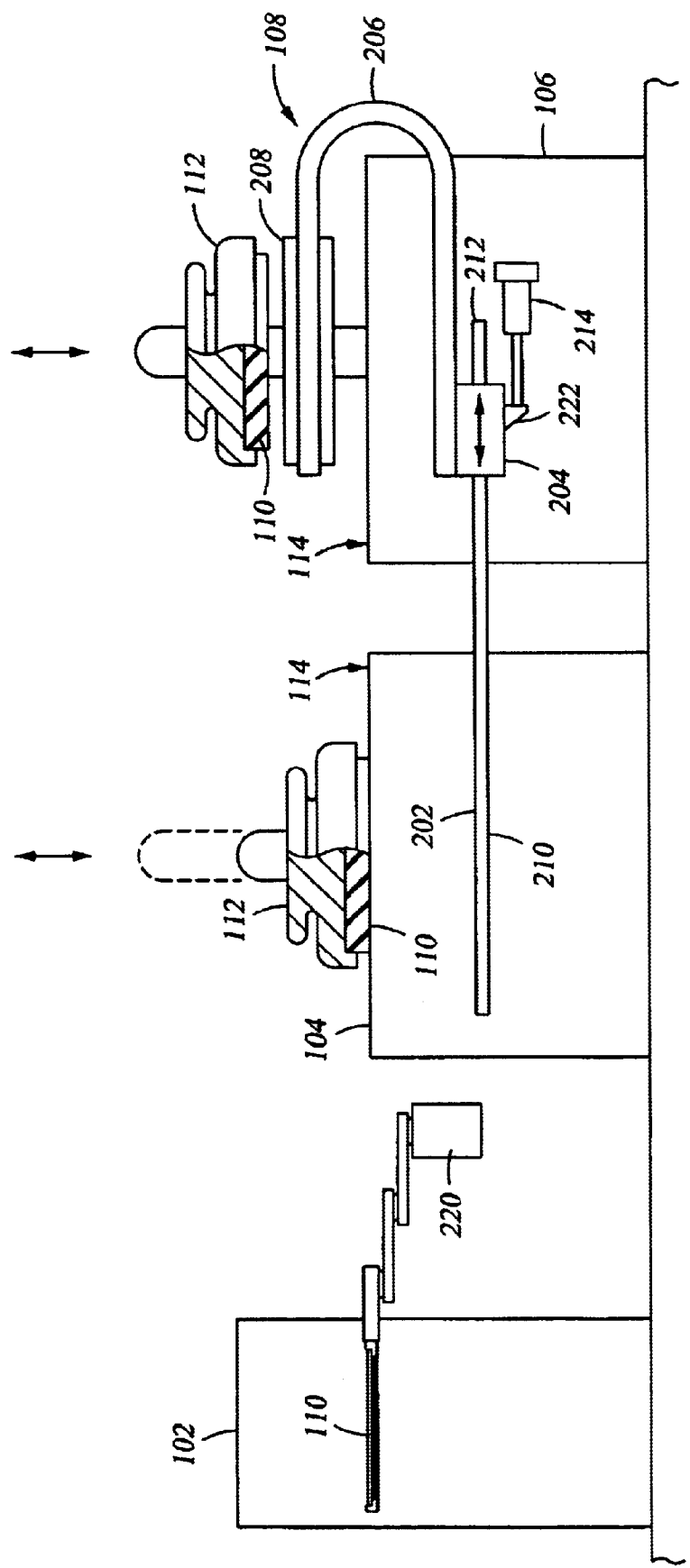
FIG. 2B is an elevation of the chemical mechanical planarization system of FIG. 1 depicting the substrate transfer shuttle loading a polishing head of a second process module.

FIGS. 2A and 2B are elevations of the system 100 depicting the substrate transfer shuttle 108 in various positions. The reader should note the illustrated substrate transfer shuttle 108 depicts one method of transferring wafers 110 between the first processing module 104 and the second processing module 106. The substrate transfer shuttle 108 may alternatively comprise other devices capable of transferring wafers between a plurality of processing modules while having the positional accuracy to enable transfer of the wafer 110 into a polishing head 112. As illustrated in FIGS. 2A and 2B, the substrate transfer shuttle 108 may be positioned in various positions along the system 100. For example, the substrate transfer shuttle 108 has a first position (see FIG. 2A) in which the substrate transfer shuttle 108 is positioned to transfer wafers 110 between the substrate transfer shuttle and the polishing heads 112 of the first processing module 104 and a second position (see FIG. 2B) in which the substrate transfer shuttle is positioned to transfer wafers between the substrate transfer shuttle and the second processing module 106. The substrate transfer shuttle 108 may be positioned elsewhere such as proximate the front end 102 to facilitate transfer of wafers to a wafer transfer mechanism 220 disposed in the front end 102 or between any of the system modules (i.e., the front end 102, the first module 104 and the second module 106).

Figure 2C:
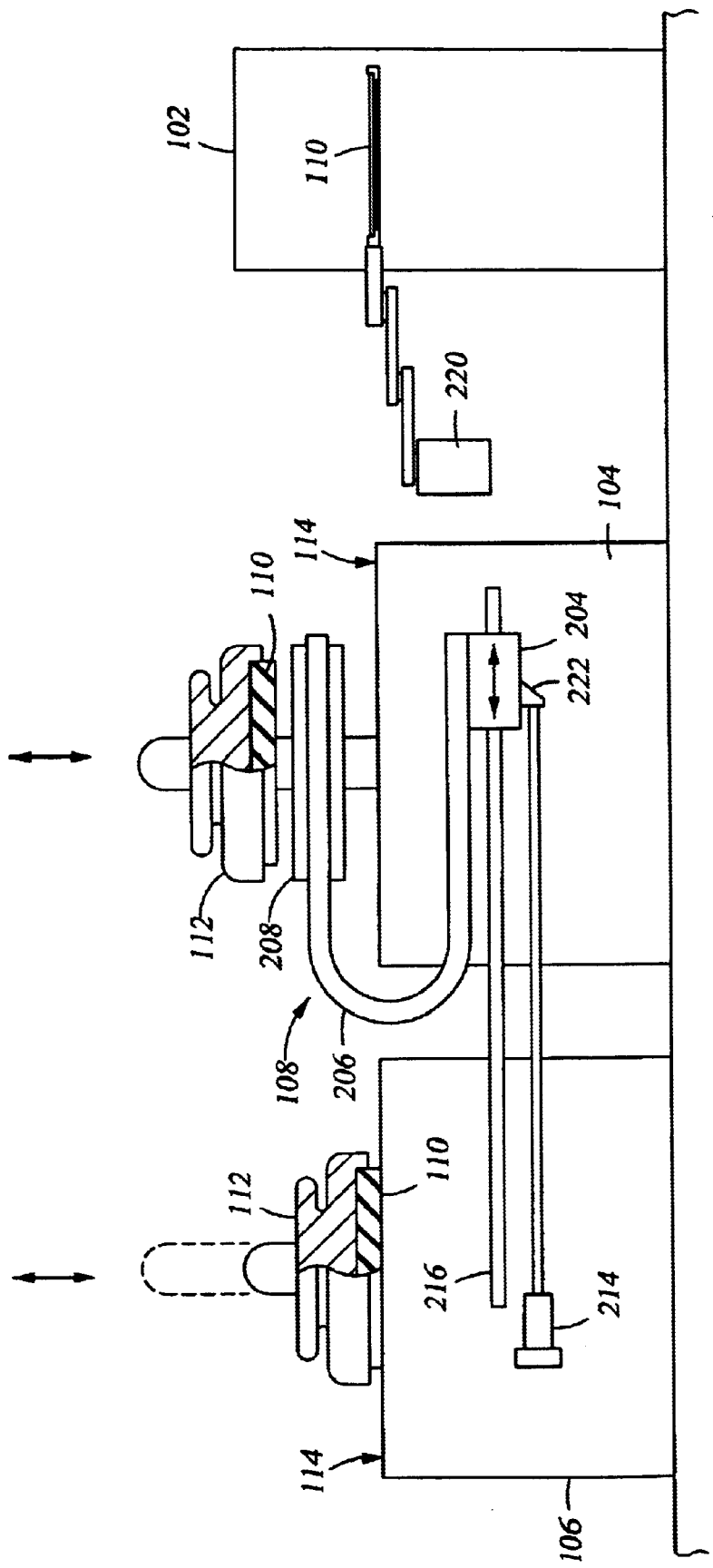
FIG. 2C is an elevation of the chemical mechanical planarization system of FIG. 1 from the side opposite FIG. 2B.

The illustrative substrate transfer shuttle 108 comprises a rail 202, a yoke 204, a support member 206 and a carrier 208. The rail 202 is generally disposed on a first side 218 of the system 100. The rail 202 has a first end 210 coupled to the first processing module 104 or the front end 102 and a second end 212 coupled to the second processing module 106. Alternatively, the rail 202 may be disposed in other positions that permit the substrate transfer shuttle 108 to have the described range of motion, for example, the rail 202 may be free-standing adjacent the first processing module 104. The rail 202 may be a linear rail, shaft or other bearing surface of sufficient strength to maintain the carrier 208 parallel in relation to the working surface 114 while facilitating movement of the substrate transfer shuttle 108. A second rail 216 is similarly situated on a second side 224 of the system 100 (see FIG. 2C).

Figure 4:
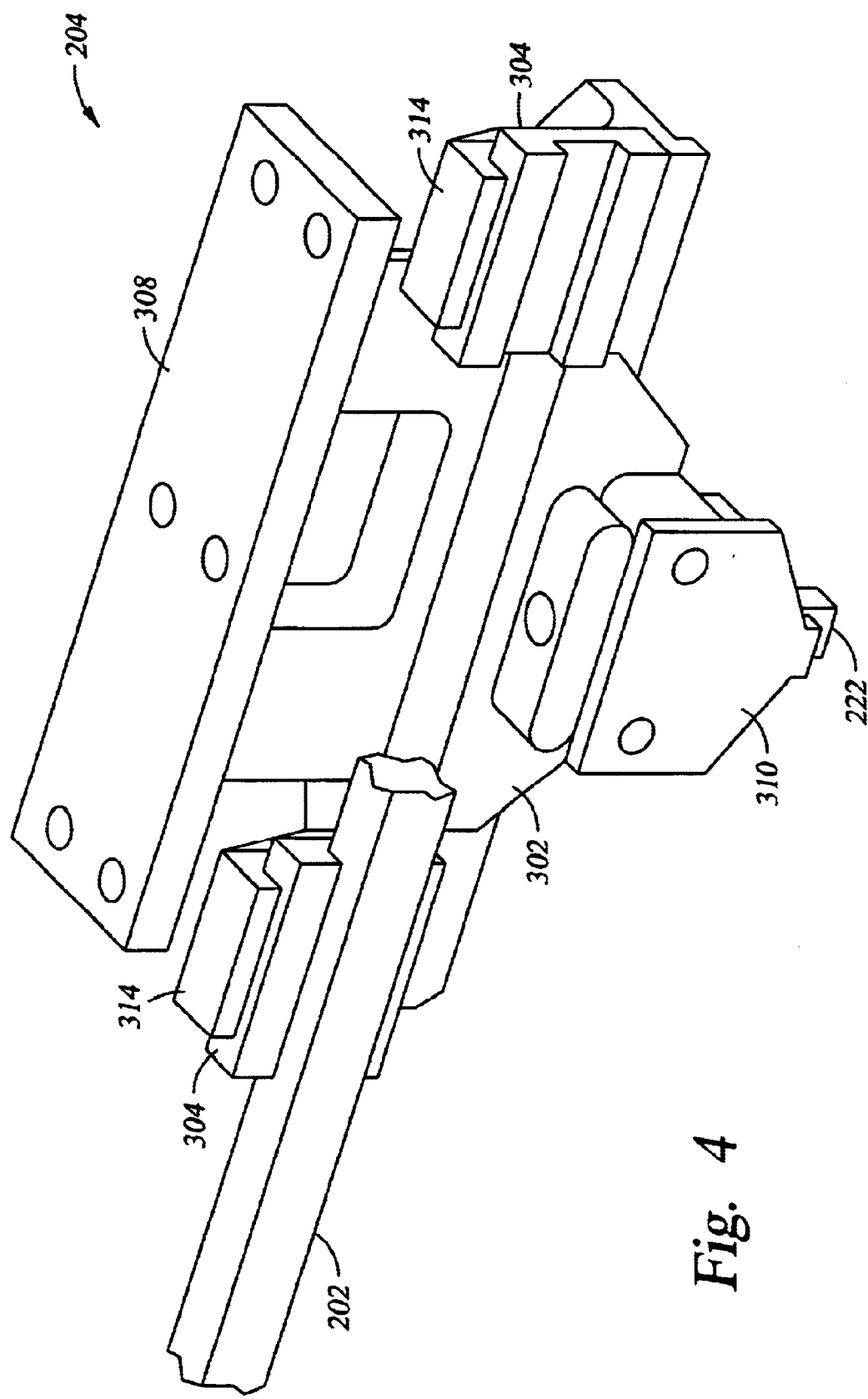
FIG. 4 is a perspective view of a yoke assembly of FIG. 2A.

FIG. 4 is a perspective view of the yoke 204. The yoke 204 comprises a frame 402, a first guide seat 412 and a second guide seat 414. The frame 402 has a mounting surface 408 disposed above the first guide seat 412 and the second guide seat 414. The mounting surface 408 is coupled to the support member 206. A first guide 404 and a second guide 406 are respectively mounted in the first guide seat 412 and the second guide seat 414. The rail 202 shown protruding through the first guide 404, additionally extends through the second guide 406 to minimize the rotation (i.e., pitching moment) of the yoke 204 about the rail 202. The guides (404 and 406) are selected to provide linear motion of the yoke 204 along the rail 202 and may comprise ball bearing, needle bearings, solid bearing, aerostatic bearings, magnetic bearings or other devices or materials suitable for facilitation of linear movement along the rail 202.

Referring back to FIG. 2A, the yoke 204 includes a drive interface 222. The drive interface 222 provides an attachment point on the yoke 204 for a drive mechanism 214 that is coupled in one embodiment between the substrate transfer shuttle 108 and the second processing module 106. The drive mechanism 214 imparts and controls the motion of the yoke 204 along the rail 202, thus controlling the position of the substrate transfer shuttle 108 in relation to the front end 102, the first processing module 104 and the second processing module 106. The drive mechanism 214 may comprise any number of linear motion devices, including pneumatic cylinders, hydraulic cylinders, sawyer motors, lead or ball screws, servo/stepper motors coupled with belt drives or other linear positional devices.

The support member 206 is generally "U-shaped" and couples the yoke 204 to the carrier 208. The support member 206 is fabricated from a rigid material that substantially prevents relative motion between the ends of the support member 206. The support member 206 is sized to allow the carrier 208 to pass under the polishing head 112 when the polishing head 112 is in a raised position.

Figure 3:
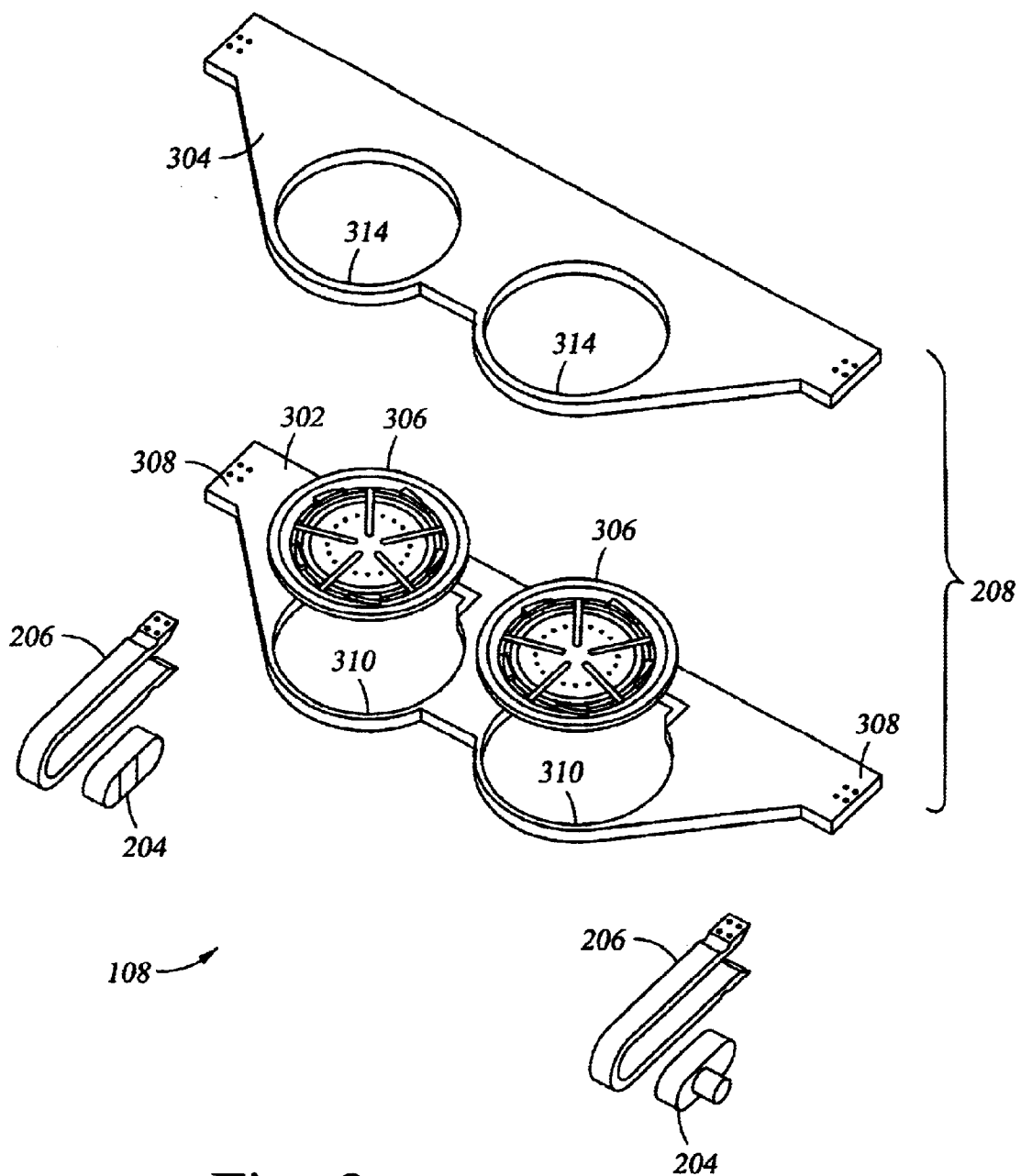
FIG. 3 is a simplified exploded perspective view of the substrate transfer shuttle of FIG. 2A.
Figure 5:
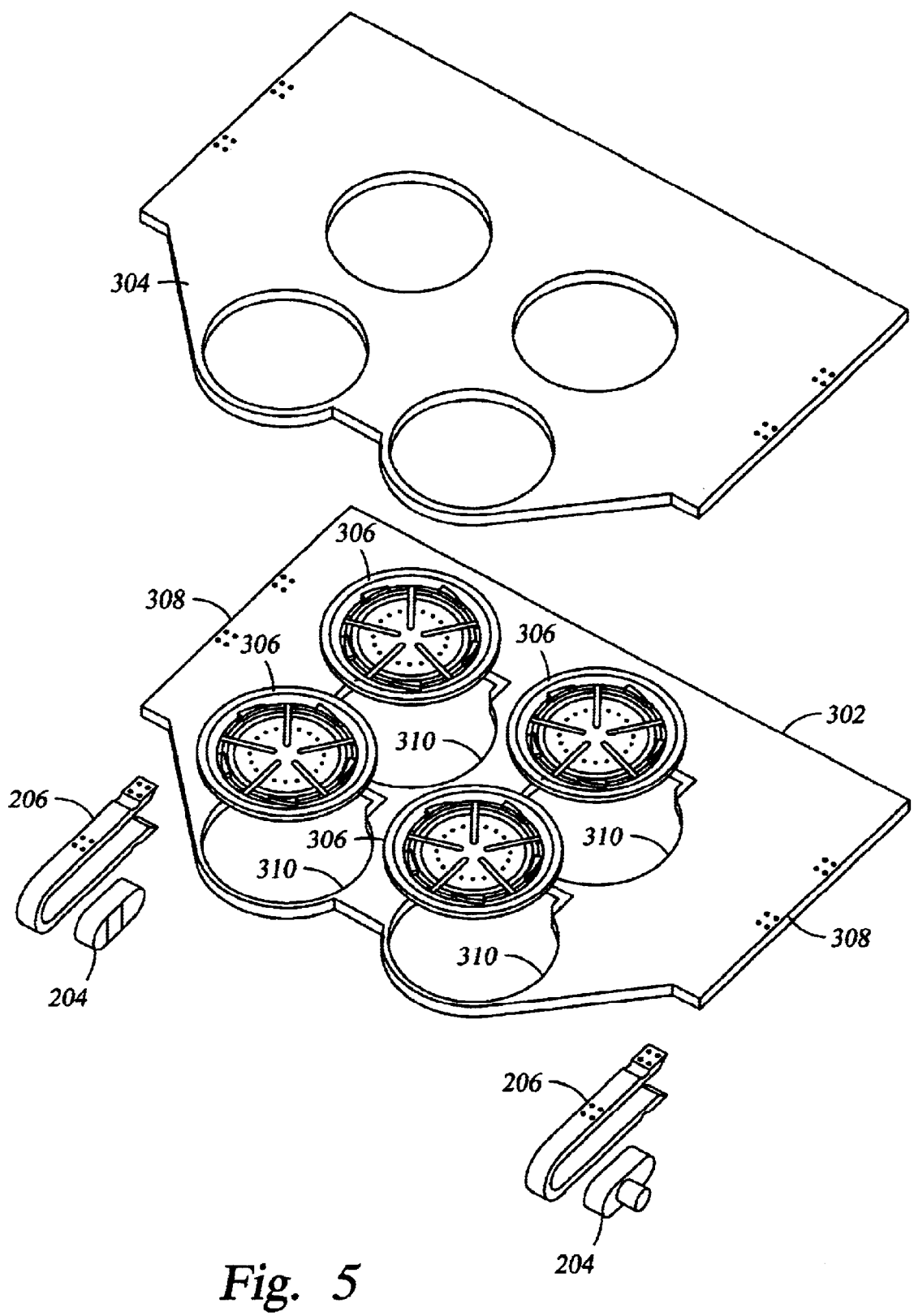
FIG. 5 is a simplified exploded perspective view of another embodiment of the substrate transfer shuttle.

FIG. 3 depicts an exploded view of one embodiment of the carrier 208. The carrier 208 generally includes a base plate 302, a cover 304 and a plurality of nests 306. The base plate 302 has a pair of mounting tabs 308 disposed on opposite sides of the base plate 302. Each tab 308 is fastened to its respective support member 206. The base plate 302 has a plurality of apertures 310 in which a corresponding nest 306 is disposed. In the illustrated embodiment, the carrier 208 comprises two nests 306 disposed laterally between the mounting tabs 308. Alternative embodiments of the carrier 208 may comprise one or more nests 306, for example, four nests 306 disposed two abreast between the mounting tabs 308 (as depicted in FIG. 5).

The cover 304 is disposed atop the base plate 302. The cover 304 has a plurality of apertures 314 positioned concentric to the apertures 310 in the base plate 302. The apertures 314 are sized to allow wafers 110 to pass therethrough. Alternatively, the apertures 314 may be configure to allow a portion of the nest 306 to pass therethrough when transferring the wafer 110 between the nest and polish head 112 (or other device).

Figure 6:
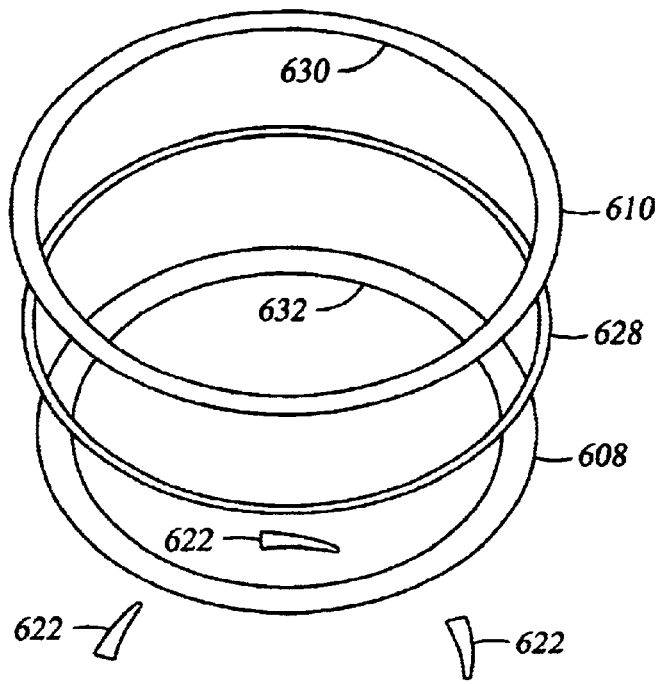
FIG. 6 is a simplified exploded perspective view of a nest of FIG. 3.
Figure 6:
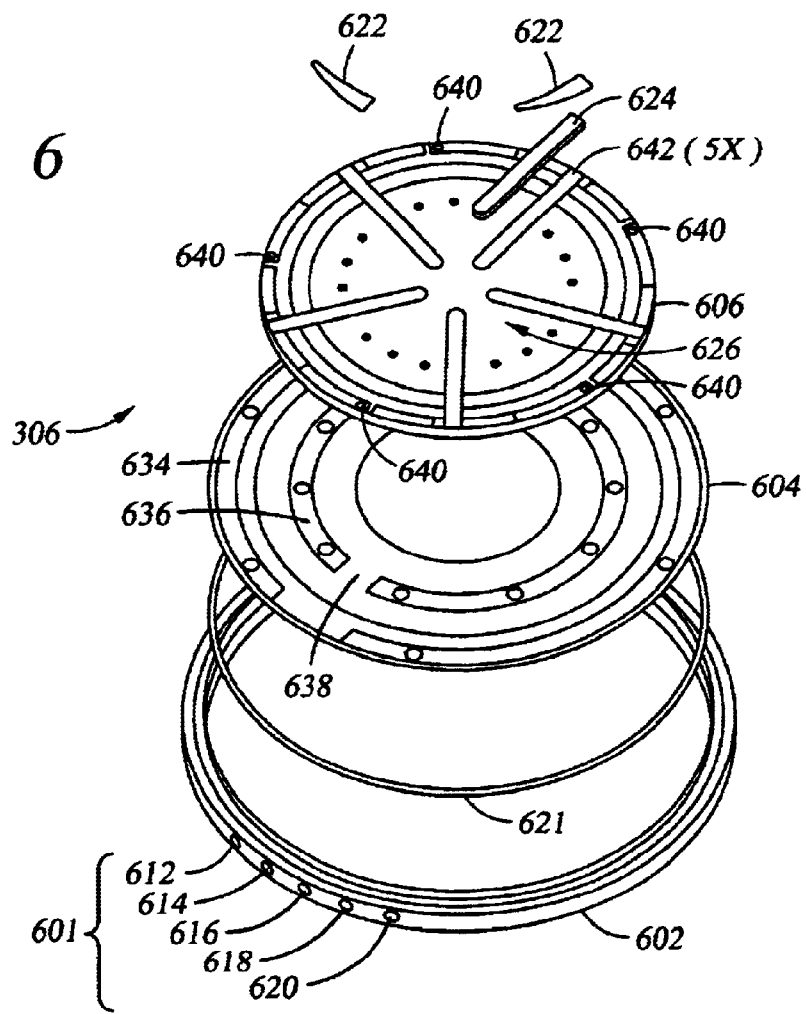

FIG. 6 is a simplified exploded view of one embodiment of the nest 306. The nest 306 comprise a base plate 602, a fluid distribution plate 604, an insert pad 606, a capture ring 608, and a collar 610. The base plate 602 has a first port 612, a second port 614, a third port 616, a fourth port 618 and a fifth port 620 that are referred to collectively as ports 601. The fluid distribution plate 604 is disposed atop the base plate 602 and sealed by an o-ring 621. The fluid distribution plate 604 generally has a plurality of channels disposed therein that distribute fluids entering the ports 601 in the base plate 602 without mixing. For example, the plate 604 includes a first channel 634 that is fluidly coupled to the first port 612, a second channel 636 that is fluidly coupled to the third port 616, and a third channel 638 that is fluidly coupled to the fifth port 620.

The insert pad 606 is disposed atop the fluid distribution plate 604. The insert pad 606 includes a lift mechanism (i.e., plurality of lift fingers 622, one of which is shown in FIG. 6) and a centering mechanism (i.e., a plurality of centering fingers 624). The centering fingers 624 project from the insert pad 606 and are set in a diameter that allows the wafer 110 to be set between the centering fingers 624. The fluid distribution plate 604 aligns with the base plate 602 such that the ports 601 align respectively with the channels in the distribution plate 604.

For example, the first port 612 is fluidly coupled to the first channel 634 in the distribution plate 604. The first channel 634 aligns with a first plurality of apertures 640 disposed in the insert pad 606. The apertures 640 are in fluid communication with the actuator of the centering fingers 624 (for example, via a piston not shown). Fluid applied to the first port 612 causes the centering fingers 624 to actuate inward, moving parallel to a plane defined by the polishing surface 114 and perpendicular to a center axis of the nest 306. Correspondingly, second port 614 is fluidly coupled through the distribution plate 604 and insert pad 606 such that fluid applied to the second port 614 causes the centering fingers 624 to actuate outward. In such an outward position, a wafer may be set into the nest 306 and rest upon the insert pad 606.

The third port 616 is fluidly coupled to the second channel 636 in the distribution plate 604. The second channel 636 aligns with a second plurality of apertures 642 disposed in the insert pad 606. The apertures 642 are in fluid communication with an actuator of the lift fingers 622 (for example, via a piston not shown). Fluid applied to the third port 616 causes the lift fingers 622 to actuate upwards from the insert pad 606. When the lift fingers 622 are moved to the extended position, the wafer 110 set in the nest 306 is lifted concentrically to the nest in a direction normal the polishing surface 114 to a position where the wafer may be retained by the polishing head 112 or other conventional wafer handling device. Correspondingly, the fourth port 618 is coupled through the distribution plate 604 and insert pad 606 such that fluid applied to the fourth port 618 causes the lift fingers 622 to actuate towards the insert pad 606. Alternately, other lift mechanisms may be employed to lift the wafer, for example, lift pins and edge grip devices.

The first port 620 is coupled through the distribution plate 604 and insert pad 606 such that fluid applied to the fifth port 620 is distributed through a plurality of holes 626 arranged about the insert pad 606. When fluid is applied to the fifth port 620, the fluid exiting the plurality of holes 626 causes a wafer set upon the insert pad 606 to "float" upon a cushion of fluid, thus preventing damage during operations such as centering the wafer. In one embodiment, de-ionized water is disposed through the holes 626 in the insert pad 606.

The capture ring 608 is disposed atop the insert pad 606 and retains the insert pad 606 to the nest 306. Disposed above the capture ring 608 is the collar 610. The capture ring 608 and the collar 610 include inner diameters 632, 630, respectively, that allow wafers 110 to access the nest 306 while additionally retaining wafers within the nest. The inner diameters 632, 630 prevent shifting of the wafer during shuttle movement or while the wafer 110 is floating on a cushion of fluid provided through the inner pad 606. An o-ring 628 seals the capture ring 608 to the collar 610.

Referring to FIGS. 2A, 2B and 6, in operation, the system 100 begins processing of the wafer 110 by first retrieving the wafer 110 from the front end 102 and loading the wafer 110 into one of the nests 306 of the substrate transfer shuttle 108. The other nests 306 of the substrate transfer shuttle 108 are subsequently loaded. Alternatively, the wafer transfer mechanism 220 may directly load the polishing heads 112 of the first processing module 104. The loaded polishing heads .112 move downward, placing the wafers 110 in contact with the working surface 114 (i.e., the polishing material). The wafers 110 are moved relative to the working surface 114 (by either moving the polishing head 112 and/or working surface 114) in a planarization pattern to uniformly remove material from the feature side of the wafer 110.

Once the process performed by the first processing module 104 is complete, the polishing heads 112 are raised, allowing the nests 306 disposed on the substrate transfer shuttle 108 to be moved under the polishing heads 112. The polishing heads 112 release the wafers 110 into the respective nests 306 and onto the cushion of fluid residing above the insert pad 606. The centering fingers 622 of each nest 306 are then actuated to center the wafer 110. The substrate transfer shuttle 108 is then moved such that the wafers 110 are positioned beneath the polishing heads 112 of the second processing module 106. The polishing heads 112 are then lowered to interface with the nests 306 of the substrate transfer shuttle 108. The lift fingers 624 are raised to transfer the wafers 110 to the polishing heads 112. Alternatively, the sequence of centering the wafers and moving the substrate transfer shuttle may be reversed to insure proper alignment of the wafers 110 to the polishing heads 112 after movement of the substrate transfer shuttle 108. Optionally, the centering fingers 624 may remain actuated while the wafers 110 are in the nests 306 to prevent shifting that may result in scratching or other damage to the wafer.

Once the wafers 110 are loaded into the polishing heads 112 of the second processing module 106, the substrate transfer shuttle 108 is moved clear of the polishing heads 112, allowing the polishing heads 112 to lower placing the wafer 110 in contact with the working surface 114 of the second planarization module 106. For example, the substrate transfer shuttle 108 can be parked between processing modules 104 and 106. After completion of the process performed at the second processing module 106, the wafers 110 are reloaded into the substrate transfer shuttle 108 and returned to the front end 102. The simultaneous transfer of the wafers 110 between processing modules provides increased system throughput.

Although the teachings of the present invention that have been shown and described in detail herein, those skilled in the art can readily devise other varied embodiments that still incorporate the teachings and do not depart from the spirit of the invention.

What is claimed is:

1. A substrate processing system for processing a workpiece comprising:
   a processing module having a horizontal polishing surface disposed therein;
   at least one polishing head disposed in the polishing module above the polishing surface and adapted to retain a feature side of the workpiece against the polishing surface during processing;
   a substrate transfer shuttle adapted to move laterally relative to the polishing head, the substrate transfer shuttle having a first position and a second position, the second position disposed adjacent the polishing head; and
   at least one nest disposed in the substrate transfer shuttle for transferring the workpiece in a feature side down horizontal orientation to the processing head.

2. The system of claim 1, wherein the second position of the substrate transfer shuttle is disposed at least partially above the polishing surface.

3. The system of claim 1, wherein the first position of the substrate transfer shuttle is proximate a second processing module.

4. The system of claim 1, wherein the substrate transfer shuttle includes two nests.

5. The system of claim 1, wherein the substrate transfer shuttle further comprises:
   a first rail disposed on one side of the processing module;
   a second rail disposed on an opposing side of the processing module; and
   at least two support members coupled to the carrier, each support member movably coupled to a respective rail.

6. The system of claim 5, wherein each support member further comprises:
   a yoke having at least two guides adapted to move along the rail.

7. The system of claim 5 further comprising at least one drive mechanism coupled to the substrate transfer shuttle.

8. The system of claim 7, wherein the drive mechanism includes one or more pneumatic cylinders, hydraulic cylinders, sawyer motors, lead or ball screws, servo motors or stepper motors.

9. The system of claim 1, wherein the nest moves parallel to the polishing surface.

10. The system of claim 1, wherein the nest further comprises:
    an insert pad adapted to support the workpiece;
    a plurality of holes disposed in the insert pad, the holes adapted to flow a fluid that supports the workpiece in a spaced-apart relation to the insert pad.

11. The system of claim 1, wherein the nest further comprises:
    a plurality of centering fingers moving between a first position and a second position in a plane parallel to a plane defined by the polishing surface, the second position inward of the first position.

12. The system of claim 1, wherein the nest further comprises:
    a plurality of lift fingers adapted to lift the workpiece from the nest.

13. The system of claim 1, wherein the processing module is a chemical mechanical polisher.

14. The system of claim 1, wherein the processing module includes at least one of a buffing station, a polishing station, a rinsing station, a storage station or a cleaning station.

15. The system of claim 1, wherein the processing module includes two polishing heads.

16. The system of claim 1, wherein the processing module includes a linear drive system.

17. The system of claim 1 further comprising a second processing module that contains at least one buffing, polishing, rinsing, storing or cleaning station.

18. A substrate processing system for processing a workpiece comprising:
    a first chemical mechanical processing module having a horizontal polishing surface disposed therein;
    a second module comprising a second chemical mechanical processing module disposed laterally adjacent the first chemical mechanical processing module;
    at least one polishing head disposed in the first chemical mechanical processing module above the polishing surface and adapted to retain the workpiece during processing;
    a substrate transfer shuttle adapted to move laterally relative to the polishing head, the substrate transfer shuttle having a first position and a second position, the first position disposed adjacent the first chemical mechanical processing module and the second position located away from the first chemical mechanical processing module; and
    at least one nest disposed in the substrate transfer shuttle for transferring the workpiece in a feature side down horizontal orientation between the first chemical mechanical processing module and the polishing head.

19. The system of claim 1, wherein the first position of the substrate transfer shuttle is proximate a factory interface.

20. The system of claim 1, wherein the processing module includes four polishing heads.

21. The system of claim 1 further comprising at least one robot adapted to dispose a substrate in the nest when the shuttle table is disposed in the first position.

22. A substrate processing system for processing a workpiece comprising:
    a first chemical mechanical processing module having a horizontal polishing surface disposed therein;

a second module comprising a factory interface;

at least one polishing head disposed in the first chemical mechanical processing module above the polishing surface and adapted to retain the workpiece during processing;

a substrate transfer shuttle adapted to move laterally from a first position towards the first chemical mechanical processing module to a second position adjacent the polishing head; and at least one nest disposed in the substrate transfer shuttle for transferring the workpiece in a feature side down horizontal orientation between the first chemical mechanical processing module and the polishing head.

23. The system of claim 22 further comprising at least one robot adapted to dispose a substrate in the nest when the shuttle table is disposed in the first position.

24. A substrate processing system for processing a workpiece comprising:

a first chemical mechanical processing module having a polishing surface disposed therein;

at least one polishing head disposed in the first chemical mechanical processing module above the polishing surface and adapted to retain the workpiece during processing;

a substrate transfer shuttle adapted to move laterally towards the first chemical mechanical processing module parallel to the plane of the polishing surface;

at least one nest fixed in a horizontal orientation on the substrate transfer shuttle for transferring the workpiece to the polishing head; and at least one robot adapted to dispose a substrate in the nest when the shuttle table is positioned away from the polishing head.

25. The system of claim 22 wherein the nest further comprises:

a base plate including at least a first port and a second port;

a fluid distribution plate disposed on the base plate;

an insert pad disposed on the distribution plate;

a plurality of centering fingers coupled to the insert pad, the centering fingers fluidly coupled to the first port through the insert pad and distribution plate; and a plurality of lift fingers coupled to the insert pad, the lift fingers fluidly coupled to the second port through the insert pad.

* * * * *